United States Patent [19]

Hayashi et al.

[11] Patent Number: 5,447,910
[45] Date of Patent: Sep. 5, 1995

[54] METHOD OF FABRICATING OXIDE SUPERCONDUCTING FILMS BY LASER DEPOSITION

[75] Inventors: Noriki Hayashi; Noriyuki Yoshida, both of Osaka, Japan

[73] Assignee: Sumitomo Electric Industries, Ltd., Osaka, Japan

[21] Appl. No.: 131,273

[22] Filed: Oct. 4, 1993

Related U.S. Application Data

[63] Continuation of Ser. No. 739,783, Jul. 31, 1991, which is a continuation of Ser. No. 523,615, May 15, 1990, abandoned.

[30] Foreign Application Priority Data

May 19, 1989 [JP] Japan .................................. 1-126849
May 26, 1989 [JP] Japan .................................. 1-132970

[51] Int. Cl.⁶ .......................... B05D 3/06; B05D 5/12
[52] U.S. Cl. .................... 505/474; 505/434; 505/732; 505/230; 427/62; 427/596; 427/126.3
[58] Field of Search ................. 505/1, 730, 732, 474, 505/230, 434; 427/62, 63, 596, 126.3

[56] References Cited

FOREIGN PATENT DOCUMENTS 62-232602  10/1987  Japan .

OTHER PUBLICATIONS

Mashburn et al, "Deposition of high Tc superconductor thin films by pulsed laser ablation," MRS, vol. 99, Nov. 1987, pp. 699-702.
Lowndes et al, "In situ growth of high quality epitaxial $YBa_2Cu_3O_{7-x}$ thin films at moderate temperatures by pulsed laser ablation", MRS, Fall Meeting (Boston, Mass.) 1989 pp. 1-4.
Burton et al, "Reactive laser deposition of high-Tc superconducting thin films" High-temperature Superconductors II, Edited by Capon II et al, Apr. 1988 pp. 77-80.

Primary Examiner—Roy V. King
Attorney, Agent, or Firm—Pennie & Edmonds

[57] ABSTRACT

An oxide superconducting film is formed using laser deposition of applying an excimer laser beam (1, 21) onto a target (3, 23) through a converging lens (2, 22) and depositing atoms and/or molecules scattered from the target (3, 23) on the base material (5). The converging lens (2) is prepared by a cylindrical lens, or the converging lens (22) is moved, so that a portion (4, 25) irradiated with the laser beam (1, 21) on the target (3, 23) is linearized. Thus, it is possible to form an oxide superconducting film which is homogeneous over a region having a relatively large area on the base material (5) not only in film thickness but also in property.

4 Claims, 3 Drawing Sheets

METHOD OF FABRICATING OXIDE SUPERCONDUCTING FILMS BY LASER DEPOSITION

This is a continuation of application Ser. No. 07/739,783, filed Jul. 31, 1991, which is a continuation of Ser. No. 07/523,615 filed May 15, 1990, now abandoned.

BACKGROUND OF THE INVENTION

1. Field of the Invention

The present invention relates to a method of fabricating an oxide superconducting film, and more particularly, it relates to a method of fabricating an oxide superconducting film using laser deposition.

2. Description of the Background Art

In order to prepare an available conductor material from an oxide superconductive material, an oxide superconducting film may be formed on a base material. While various methods have been proposed for forming such oxide superconducting films on base materials, high critical density values are obtained with respect to the oxide superconducting films by vapor phase methods such as sputtering, vacuum deposition, deposition using a laser, CVD, and the like. Within these methods, the deposition using a laser, i.e., laser deposition is particularly suitable for fabrication of an oxide superconducting film having high critical current density, because of a high speed of film formation and capability of film formation in a high-pressure atmosphere.

In relation to such laser deposition, further, an excimer laser is particularly advantageously employable for fabricating an oxide superconducting film, which exhibits excellent superconducting properties. In fact, oxide superconducting films having high critical current density have been successfully formed using the excimer laser.

In a conventional method of forming an oxide superconducting film using an excimer laser, the laser beam has been applied through a spherical lens to form a spot on a target. In other words, only an extremely limited region of the target has been irradiated with the laser beam. Consequently, deposition particles are scattered from the target only in a limited range, to restrict the area of the oxide superconducting film homogeneously formed on a base material, which is opposed to the target, not only in film thickness but also in property.

SUMMARY OF THE INVENTION

Accordingly, an object of the present invention is to provide a method of fabricating an oxide superconducting film, which enables formation of an oxide superconducting film being homogeneous not only in film thickness but also in property over a region, having a relatively large are, of a base material.

The present invention is directed to a method of fabricating an oxide superconducting film using laser deposition, which is adapted to apply a laser beam onto a target of an oxide superconductive material through a converging lens for depositing atoms and/or molecules scattered from the target on a base material.

The present invention is characterized in that a portion of the target irradiated with the laser beam is linearized.

In order to linearize the portion irradiated with the laser beam as described above, employed is a method of linearizing the sectional configuration of the laser beam, or a method of reciprocating the portion irradiated with the laser beam on the target. In the former method, a cylindrical lens is employed as the converging lens, for example. In the latter method, on the other hand, the converging lens is reciprocated, for example.

According to the present invention, a long flexible base material is advantageously employed as the base material. Such a flexible base material is formed of a ceramic material such as stabilized zirconia, alumina, yttria, silica or titania, or a metal material such as platinum, gold, silver, aluminum, nickel, hastelloy, inconel, incoloy or stainless steel.

According to the present invention, an excimer laser beam, for example, emitted from a laser beam source defines a linear irradiated portion on the target. Therefore, an area of the target for scattering atoms and/or molecules in the vapor phase is increased, whereby it is possible to increase the area of an oxide superconducting film homogeneously deposited on the base material not only in film thickness but also in property.

Thus, the present invention can be effectively applied to formation of an oxide superconducting film over a relatively wide range, or to formation of an oxide superconducting film on a long base material.

According to the present invention, it is possible to obtain an oxide superconducting wire rod which is applied to a superconducting coil, a superconducting cable or the like, for example, by using a long flexible base material.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
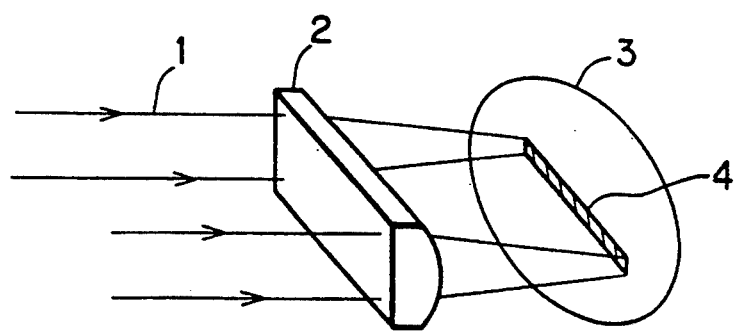
FIG. 1 is an enlarged perspective view showing a part of an optical system included in a laser deposition film forming apparatus for carrying out an embodiment of the present invention.
Figure 2:
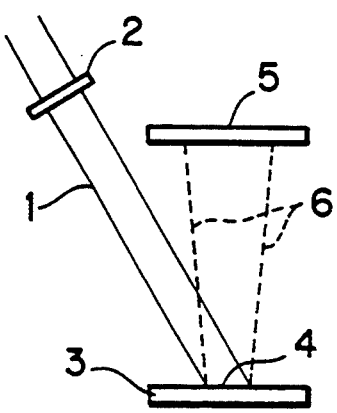
FIG. 2 is a front elevational view schematically showing the laser deposition film forming apparatus including the optical system shown in FIG. 1.

FIG. 1 is an enlarged view showing a part of an optical system which is provided in a laser deposition film forming apparatus employed for carrying out an embodiment of the present invention. FIG. 2 schematically shows the laser deposition film forming apparatus having the optical system partially shown in FIG. 1.

Referring to FIG. 1, an excimer laser beam 1, for example, emitted from a laser beam source (not shown) is converged by a cylindrical lens 2 and applied onto a target 3. The excimer laser beam 1 is emitted to the exterior as a beam having a rectangular section, due to its principle of generation. When the excimer laser beam 1 passes through the cylindrical lens 2, its sectional configuration is linearized to define a linear irradiated portion 4 on the target 3, as shown in FIG. 1. The cylindrical lens 2 is formed by that of 10 mm by 30 mm, for example, in FIG. 1.

Referring to FIG. 2, the laser beam 1 converged through the cylindrical lens 2 is applied onto the target 3, so that a locus 6 of atoms and/or molecules scattered from the target 3, i.e., deposition particles, is provided toward a base material 5, as shown by broken lines. Such a locus 6 of the deposition particles extends over a relatively wide region toward the base material 5.

EXAMPLE 1

The laser deposition film forming apparatus described above with reference to FIGS. 1 and 2 was employed to form a film under film forming conditions listed in Table 1.

TABLE 1

| Laser Wavelength | 193 nm (ArF) |
| --- | --- |
| Base Material | Polycrystalline YSZ |
| Film Forming Temperature | 750° C. |
| Gas | $O_2$ |
| Gas Pressure | 100 mTorr |
| Laser Intensity | 1 J/cm$^2$ |
| Laser Frequency | 10 Hz |
| Target | $Y_1Ba_2Cu_3O_x$ |

Figure 3:
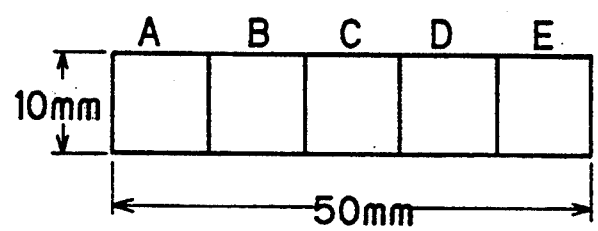
FIG. 3 is a plan view showing a base material employed in Example 1, based on the embodiment shown in FIG. 1, and reference example 1.

FIG. 3 shows a plate of polycrystalline YSZ (yttria stabilized zirconia) of 10 mm × 50 mm, which was employed as the base material. This base material was divided into five regions A, B, C, D and E as shown in FIG. 3, in order to examine properties of an oxide superconducting film deposited thereon. Table 2 shows critical temperature $T_C$ measured on the respective regions.

TABLE 2

| | $T_C$ (K) |
| --- | --- |
| A | 81 |
| B | 87 |
| C | 88 |
| D | 88 |
| E | 80 |

REFERENCE EXAMPLE 1

Figure 4:
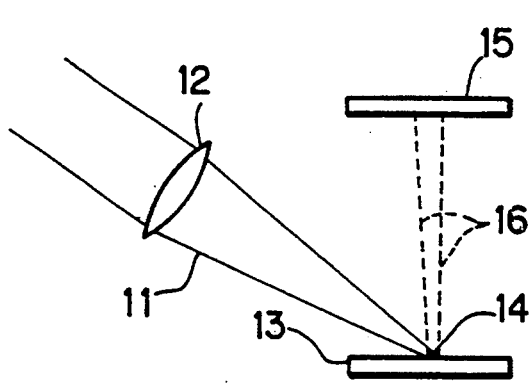
FIG. 4 is a front elevational view corresponding to FIG. 2, schematically illustrating a laser deposition film forming apparatus employed for carrying out reference example 1.

FIG. 4 is a diagram corresponding to FIG. 2, showing a laser deposition film forming apparatus employed for carrying out reference example 1.

An excimer laser beam 11 is converged by a spherical lens 12, and applied onto a target 13. A portion 14 of the target 13 irradiated with the laser beam 11 is limited in a narrow region. Thus, a locus 16 of deposition particles from the target 13 toward a base material 15 is also limited in a narrow range.

The laser deposition film forming apparatus shown in FIG. 4 was employed to form an oxide superconducting film on a base material having the dimensions and configuration shown in FIG. 3, under the film forming conditions listed in Table 1. Table 3 shows critical temperatures $T_C$ measured on portions A, B, C, D and E of this base material.

TABLE 3

| | $T_C$ (K) |
| --- | --- |
| A | — |
| B | 40 |
| C | 88 |
| D | 38 |
| E | — |

Comparing Table 2 according to Example 1 with Table 3 according to reference example 1, it is understood that an oxide superconducting film having homogeneous superconducting properties over a wide area has been obtained according to the present invention.

Figure 5:
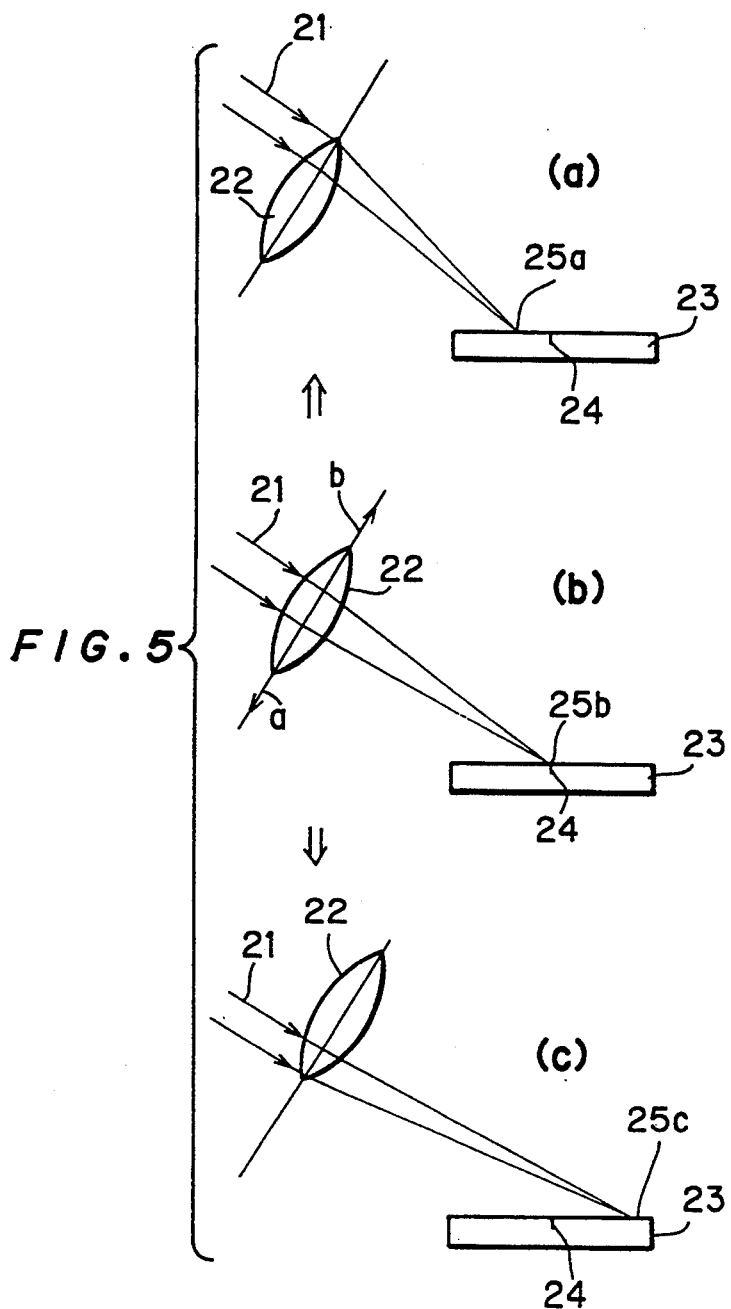
FIG. 5 illustrates a state of carrying out another embodiment of the present invention.

FIG. 5 illustrates a state of carrying out another embodiment of the present invention.

Figure 6:
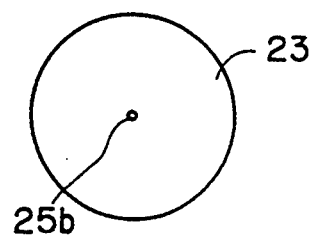
FIG. 6 is a plan view showing an irradiated portion 25b on a target 23 in the state shown at FIG. 5(b)

An excimer laser beam 21 passes through a spherical lens 22, to be converged to the center 24 of a target 23 as shown at FIG. 5(b), for example. At this time, a spot-like irradiated portion 25b is defined on the target 23, as shown in FIG. 6.

Figure 7:
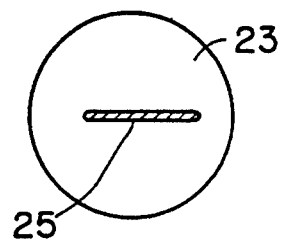
FIG. 7 is a plan view showing an irradiated portion 25 on the target obtained by movement of a spherical lens 22 shown in FIG. 5.

During the aforementioned irradiation of the laser beam 21, the lens 22 is subjected to parallel translation, for example. When the lens 22 is translated in parallel along an arrow a, the state shown at FIG. 5(a) is attained such that a portion 25a irradiated with the laser beam 21 through the lens 22 leftwardly deviates from the center 24 of the target 23. When the lens 22 is translated along another arrow b on the other hand, a portion 25c irradiated with the laser beam 21 through the lens 22 rightwardly deviates from the center 24 of the target 23. Thus, it is possible to increase the area of an irradiated portion 25 on the target 23 as shown in FIG. 7, by translating the lens 22 in the aforementioned manner.

Example 2 carried out in accordance with the above embodiment is now described in detail, followed by description of reference example 2.

EXAMPLE 2

Figure 8:
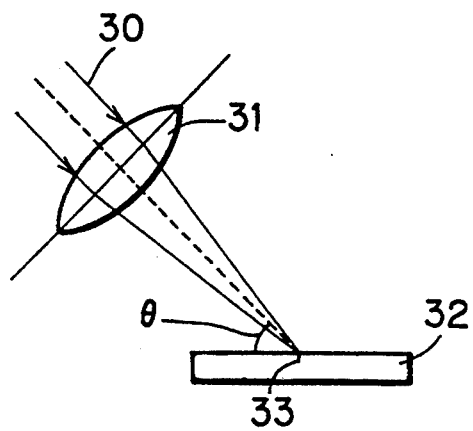
FIG. 8 is an explanatory diagram showing an optical system provided in an apparatus employed in Example 2, based on the embodiment shown in FIG. 5, and reference example 2.
Figure 9:
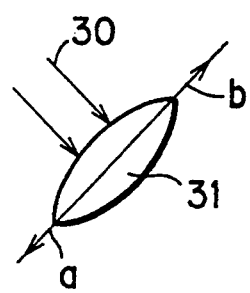
FIG. 9 is an explanatory diagram showing movement of a spherical lens 31 shown in FIG. 8.
Figure 10:
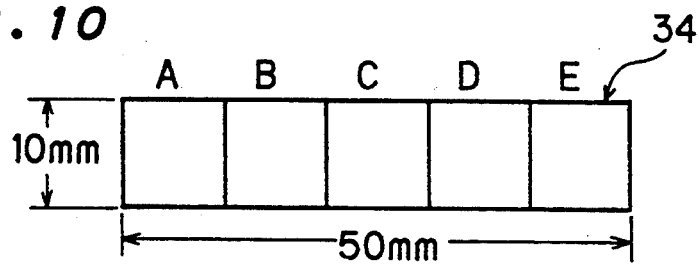
FIG. 10 is a plan view showing a base material employed in Example 2 according to FIG. 8 and reference example 2.

A Y-Ba-Cu-O oxide superconducting film was formed using an excimer laser. As shown in FIG. 8, a laser beam 30 emitted from a laser source (not shown) was applied onto a target 32 through a spherical lens 31. The spherical lens 31 was prepared by that of 60 mm in diameter, and the laser beam 30 incident upon this spherical lens 31 was 30 mm in width. The laser beam 30 passing through the spherical lens 31 was converged to the center 33 of the target 32 at a certain point of time, with a distance of 30 mm between the spherical lens 31 and the center 33. The laser beam 32 was incident upon the target 32 at an angle $\theta$ of 45°. The spherical lens 31 was subjected to parallel reciprocation along arrows a and b, as shown in FIG. 9. A base material 34 (not shown in FIG. 8) of flexible yttria stabilized zirconia (YSZ) of 10 mm × 50 mm in size and 0.2 mm in thickness was arranged immediately above the target 32 with a spacing of 30 mm. FIG. 10 shows a plane configuration of this base material 34.

This apparatus was employed for depositing a Y-Ba-Cu-O oxide superconducting film on the base material 34 under film forming conditions listed in Table 4.

TABLE 4

| Laser | ArF, 193 nm |
| --- | --- |
| Target | $Y_1Ba_2Cu_3O_x$ compound |
| Base Material Temperature | 750° C. |
| Gas | $O_2$ |
| Pressure | 0.1 Torr |
| Energy Density | 1 J/cm$^2$ |
| Laser Frequency | 10 Hz |

Figure 11:
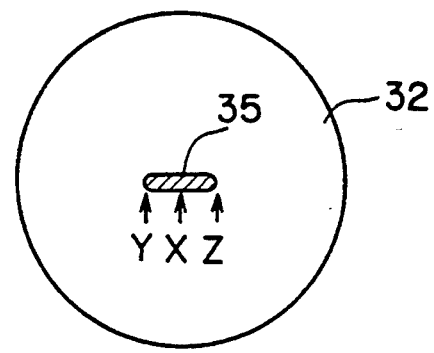
FIG. 11 is a plan view showing an irradiated portion 35 formed on a target 32 in Example 2 according to FIG. 8.

During the aforementioned film forming operation, the spherical lens 31 was reciprocated as shown in FIG. 9, so that the convergence point of the laser beam 30 was moved between a point X corresponding to the center 33 (FIG. 8) and points Y and Z separated from the point X by 15 mm respectively as shown in FIG. 11. Thus, a longitudinal irradiated portion 35 was defined on the target 32.

After the film formation, heat treatment was performed in an oxygen atmosphere at 400° C. for one hour. The base material 34 was divided into five regions A, B, C, D and E as shown in FIG. 10 in order to examine homogeneity of the oxide superconducting film deposited thereon. Table 5 shows on the line of Example 2 critical temperatures [K] measured on the respective regions A to E.

TABLE 5

|  | A | B | C | D | E |
| --- | --- | --- | --- | --- | --- |
| Example 2 | 80 | 83 | 84 | 84 | 82 |
| Reference Example 2 | — | 76 | 85 | 79 | — |

REFERENCE EXAMPLE 2

A film was formed under conditions similar to those of Example 2 except for that no movement of the spherical lens 31 as shown in FIG. 9 was performed. This film was heat treated under conditions similar to the above. Table 5 also shows on the line of Reference Example 2 critical temperatures measured on respective regions of the obtained oxide superconducting film.

Comparing the results of Example 2 with those of reference example 2 listed in Table 5, it is understood that an oxide superconducting film having homogeneous superconducting properties over a wide area has been obtained according to the present invention.

In order to linearize the portion of the target irradiated with the laser beam according to the present invention, the sectional configuration of the laser beam applied onto the target is linearized in the first method, while the portion of the target irradiated with the laser beam is reciprocated on the target in the second method. In the first method, a cylindrical lens, for example, is employed in order to linearize the sectional configuration of the laser beam, while such a cylindrical lens may be replaced by other optical means. In the second method, a converging lens is reciprocated, for example, while a reflecting mirror, for example, may be provided in relation to the path of the laser beam, to be reciprocated.

Although the base material has been prepared from stabilized zirconia in each Example, a base material of another ceramic material such as alumina, yttria, silica or titania, or a metal material such as platinum, gold, silver, aluminum, nickel, hastelloy, inconel, incoloy or stainless steel may be employed to attain an effect substantially similar to that attained with the base material of stabilized zirconia.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of fabricating an oxide superconducting film using laser deposition by applying a laser beam onto a target of an oxide superconducting material through a converging lens and depositing atoms and/or molecules scattered from said target onto a base material, comprising the steps of:
   irradiating with said laser beam a pattern on said target comprising said atoms and/or molecules;
   linearizing said pattern to become a linear sectional configuration on said target with said converging lens; and
   depositing said atoms and/or molecules scattered from said target on said base material to form said oxide superconducting film.

2. A method of fabricating an oxide superconducting film using laser deposition in accordance with claim 1 wherein said converging lens is a cylindrical lens.

3. A method of fabricating an oxide superconducting film using laser deposition in accordance with claim 1 wherein said base material is a ceramic material selected from the group consisting of stabilized zirconia, alumina, yttria, silica and titania, and a material selected from the group consisting of platinum, gold, silver, aluminum, nickel, hastelloy, inconel, incoby and stainless steel.

4. A method of fabricating an oxide superconducting film using laser deposition in accordance with claim 1 wherein said base material is in the shape of a rod.

* * * * *